United States Patent [19]

Bartlett

[11] Patent Number: 5,696,464
[45] Date of Patent: Dec. 9, 1997

[54] OUTPUT DRIVER ADAPTABLE TO POWER SUPPLY VARIATION

[75] Inventor: Donald M. Bartlett, Ft. Collins, Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 759,456

[22] Filed: Dec. 5, 1996

Related U.S. Application Data

[63] Continuation of Ser. No. 484,048, Jun. 7, 1995, abandoned, which is a continuation of Ser. No. 141,820, Oct. 22, 1993, abandoned.

[51] Int. Cl.$^6$ ............................................. H03K 3/01
[52] U.S. Cl. .................................................. 327/538
[58] Field of Search ........................... 323/312, 313, 323/314, 315; 327/530, 535, 537, 538, 540, 541, 108, 109

[56] References Cited

U.S. PATENT DOCUMENTS

| | | | |
|---|---|---|---|
| 4,389,702 | 6/1983 | Clemente et al. | 363/21 |
| 4,464,619 | 8/1984 | Schwarz et al. | 320/2 |
| 4,782,247 | 11/1988 | Yoshida | 307/449 |
| 4,859,870 | 8/1989 | Wong et al. | 327/108 |
| 4,883,979 | 11/1989 | Tran | 326/84 |
| 4,902,910 | 2/1990 | Hsieh | 307/296.4 |
| 4,972,517 | 11/1990 | Koudou et al. | 307/270 |
| 5,049,806 | 9/1991 | Urakawa et al. | 323/314 |
| 5,130,564 | 7/1992 | Sin | 307/246 |
| 5,138,201 | 8/1992 | Ohbayashi et al. | 307/530 |
| 5,235,219 | 8/1993 | Cooperman et al. | 307/443 |

*Primary Examiner*—Matthew V. Nguyen
*Attorney, Agent, or Firm*—Wayne P. Bailey

[57] ABSTRACT

The invention concerns an adaptive driver circuit which can source and sink current when powered by different power supply voltages. The invention maintains the output voltage substantially constant, for a given load, when the voltage of the power supply changes.

9 Claims, 11 Drawing Sheets

OUTPUT DRIVER ADAPTABLE TO POWER SUPPLY VARIATION

This is a continuation of application Ser. No. 08/484,048 filed Jun 7, 1995 which is a continuation of application Ser. No. 08/141,820 filed Oct. 22, 1993, both abandoned.

BACKGROUND OF THE INVENTION

Reduction in Supplied Voltage is Desired

In electronic circuits, it is desired to reduce power consumption by reducing supply voltage. However, for manufacturers of complex devices, such as digital electronic computers, it is not feasible to immediately implement a low supply voltage for every component in the entire device. Consequently, manufacturers will gradually change over to the lower voltage and, during the changeover, the manufactured devices will be hybrids: they will contain both high- and low-voltage supplies.

In these hybrid devices, a given component may be required to operate from either supply voltage. This requirement can pose certain problems, such as the following.

FIG. 1 illustrates four different conditions for a CMOS inverter. The upper two conditions (FIGS. 1A and 1B) illustrate a high supply voltage, namely, 5 volts. The lower two conditions (FIGS. 1C and 1D) illustrate a low supply voltage, namely, 3.3 volts. For each voltage, a low output (in FIGS. 1A and 1C) and a high output (in FIGS. 1B and 1D) are shown.

Assume that the following requirements are imposed on the circuit.

Rule 1. The circuit must SINK up to 8 milliamps (mA) of current, while maintaining Vo at or below 0.4 volts.

Rule 2. The circuit must SOURCE up to 8 mA of current, while maintaining Vo at or above 2.5 volts.

Rule 1

FIGS. 1A and 1C relate to Rule 1. If N-channel MOSFET 3 is designed such that its equivalent ON-resistance is 50 ohms or less, then, when sinking 8 mA, Vo will always be 0.4 volts or less, because Vo=8 mA×50 ohms=0.4 volts. This value of Vo exists irrespective of whether the supply voltage is (A) 5 volts, as in FIG. 1A, or (B) 3.3 volts, as in FIG. 1C, because Vo is determined by the product of (current sunk ×MOSFET 3 resistance).

However, if
(a) the load resistance stays the same,
(b) the supply voltage is changed, to 3.3 volts, as in FIG. 1C, and
(c) the resistance of MOSFET 3 changes (because dependent upon supply voltage),
then the voltage divider consisting of MOSFET3 and the LOAD can drive Vo to a voltage such as 0.518 volts. Now, Rule 1 is no longer met.

Therefore, the device shown in FIG. 1 may not always meet the requirement of Rule 1.

Rule 2

FIGS. 1B and 1D relate to Rule 2. If P-channel MOSFET 6 is designed such that its equivalent ON-resistance is 100 ohms or less, then, when sourcing 8 mA, Vo will always be 2.5 volts or greater, irrespective of whether the supply voltage is (A) 5 volts, as in FIG. 1B, or (B) 3.3 volts, as in FIG. 1D.

The reason is that the voltage drop across the P-channel MOSFET 6 will equal 8 mA×100 ohms, or 0.8 volts. In FIG. 1B, with this voltage drop, Vo will be 4.2 volts (i.e., 5.0−0.8 volts). In FIG. 1D, with this voltage drop, Vo will be 2.5 volts (i.e., 3.3−0.8 volts). Vo in both cases is 2.5 volts or greater.

However, a phenomenon, similar to that above, should be noted. If the MOSFET 6 has an ON resistance of 100 ohms and if the LOAD is a resistance of 625 ohms, as in FIG. 1D, then the current sourced will be 8 mA, and Vo will be 2.5 volts, both as required.

If the supply voltage is changed to 5 volts as in FIG. 1B, then Vo becomes about 3.8 volts, and the current sourced becomes about 12.2 mA. While Rule 2 is still met, both Vo and the sourced current have increased. There may arise situations wherein these increases may not be acceptable.

Rules 1 and 2 Can be Met

Even if Rules 1 and 2 are met, and without increased current, another problem can arise, namely, a noise problem at high-frequency operation. This noise results from switching transients.

As shown in FIG. 2, inductance L and resistance R exists in both (A) the line LL extending from the integrated circuit IC to the connector pin P and (B) the trace T (carried by a printed circuit board, not shown), extending from the pin P. (There is belief that the inductance and resistance of line LL, rather than on trace T, is the major contributor of the problem now-to-be-described.)

The resistance R and inductance L cause large voltage transients when the current through R and L switches ON or OFF. The current, by itself, produces a voltage because of the resistance R of the line: the voltage equals current times resistance: V=IR, as indicated.

The CHANGING current causes an additional voltage because of the inductance L of the line. This latter voltage equals the rate of change of the current, dI/dT, times L, as indicated.

These two voltages represent unwanted noise which can interfere with operation of the overall system. One approach to reducing the noise is to split the current into two paths, as shown in FIG. 3. With the split, half the current is carried in each path, and the noise voltages are reduced.

However, this approach is very expensive. Adding the second path requires at least one additional connector pin P, and possibly a second. That is, an additional pin is needed for the voltage source, such as the 5-volt source in FIG. 1, and an additional pin is may be needed for the ground in FIG. 1.

OBJECTS OF THE INVENTION

It is an object of the invention to provide an improved driver for an integrated circuit.

It is a further object to provide a driver for an integrated circuit which can accommodate different supply voltages.

SUMMARY OF THE INVENTION

In one form of the invention, an auxiliary driver is supplied which allows a primary driver to source and sink maximum current, within prescribed voltage limits, and without excessive switching noise.

DETAILED DESCRIPTION OF THE INVENTION

Simplified Overview

Figure 1:
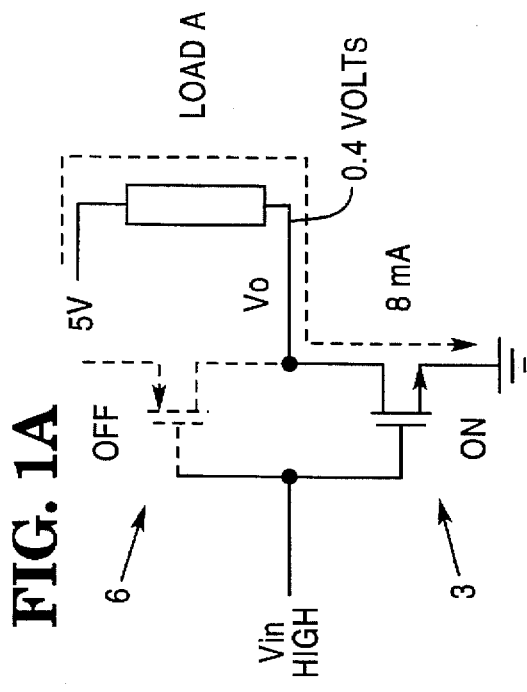
FIGS. 1A–1D illustrate one approach to changing the power supply for a CMOS inverter, or driver.
Figure 2:
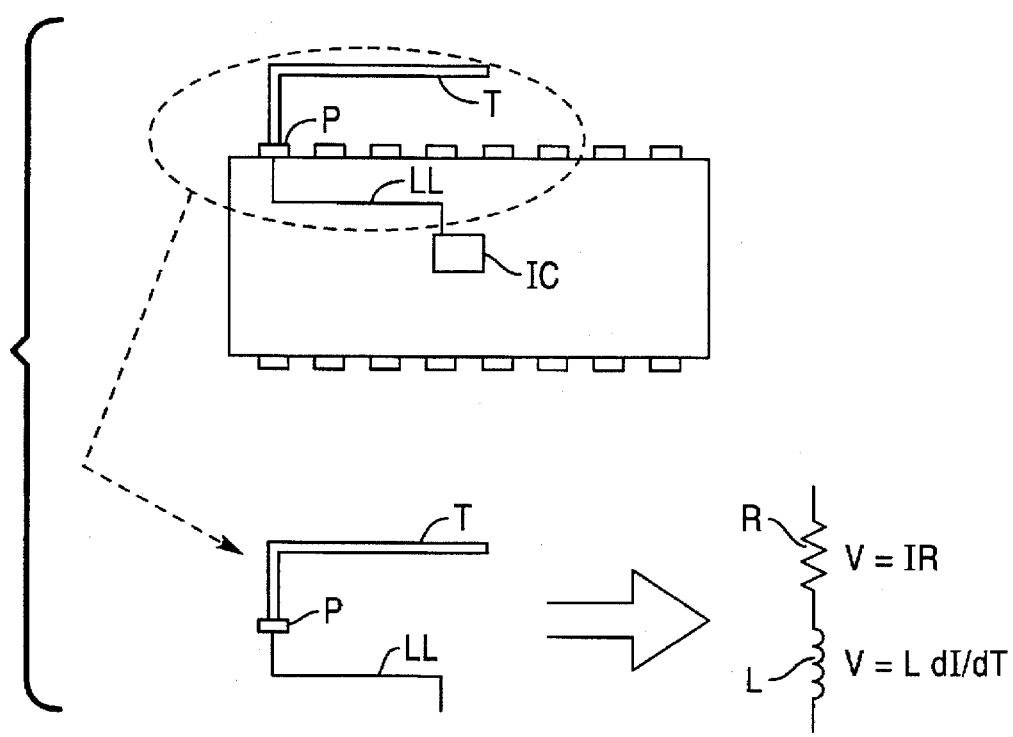
FIG. 2 illustrates resistance R and inductance L in lines associated with an integrated circuit.
Figure 3:
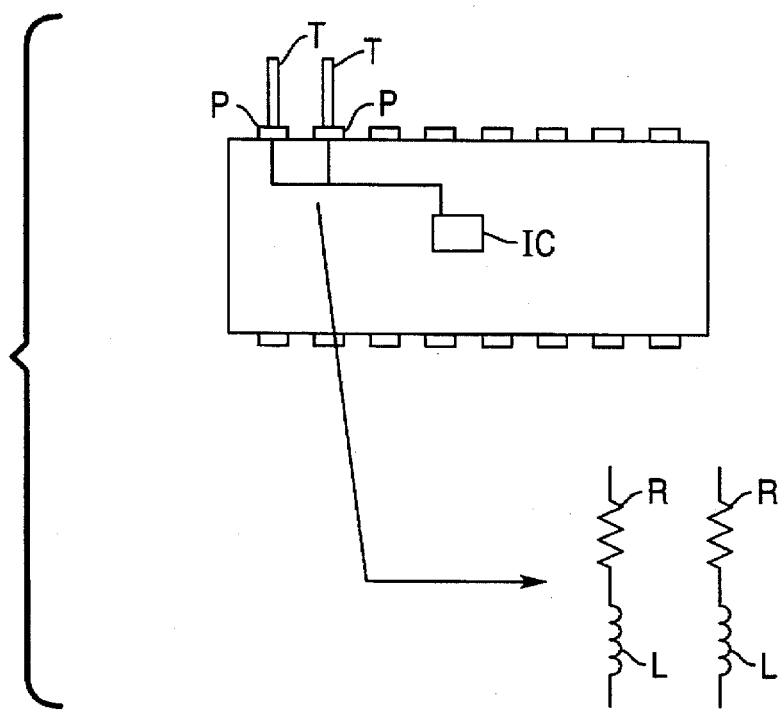
FIG. 3 illustrates one solution to problems caused by the resistance and inductance of FIG. 2.
Figure 4:
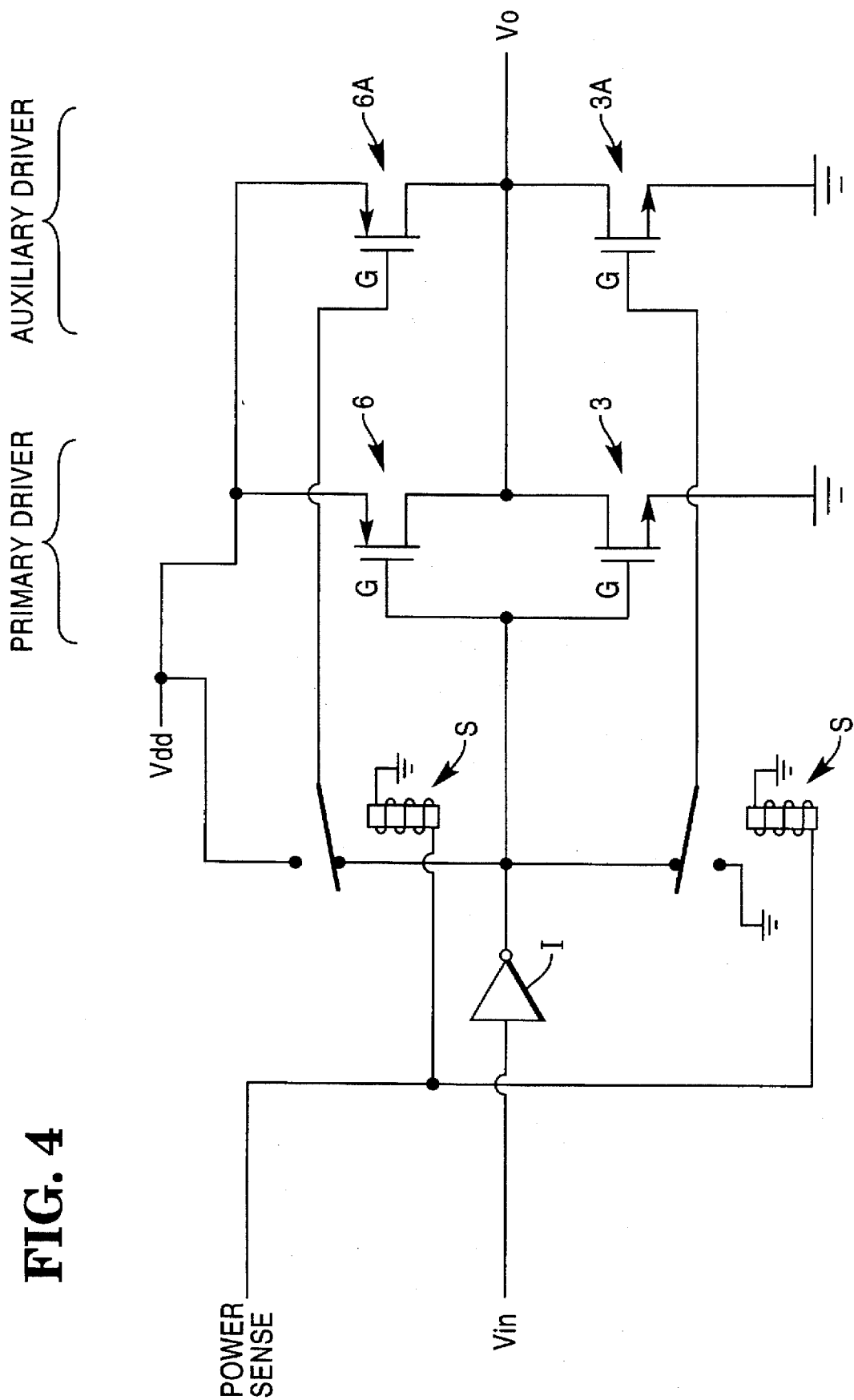
FIGS. 4 and 5 illustrate one form of the invention. MOSFETs 6 and 6A are p-channel type; MOSFETs 3 and 3A are n-channel type.
Figure 5:
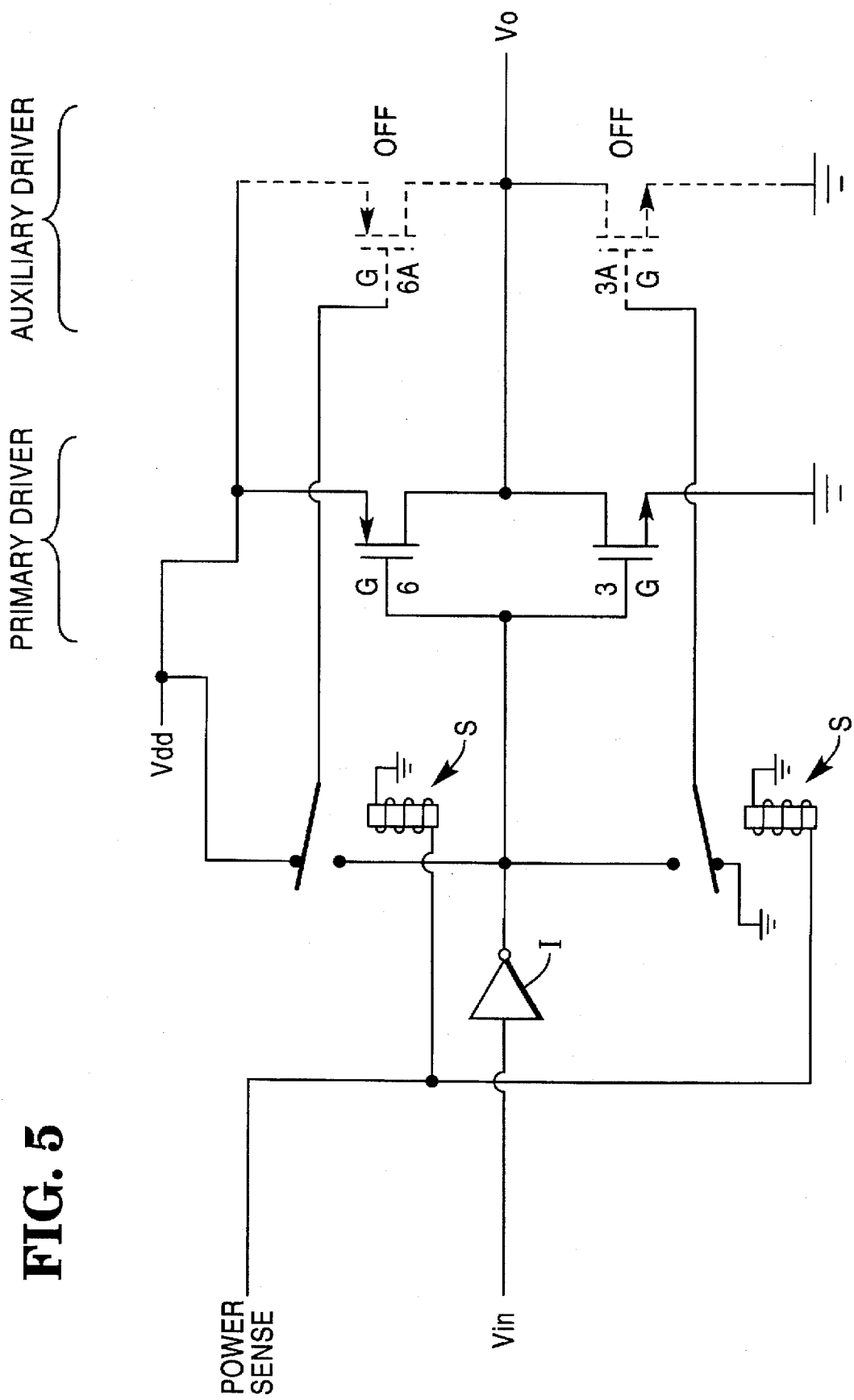

FIGS. 4 and 5 illustrate some of the principles of the invention. A PRIMARY DRIVER, similar to that of FIG. 1, is provided. In addition, an AUXILIARY DRIVER is provided. The AUXILIARY DRIVER is connected in one of two ways, by switches S. The switches S are controlled by a POWER SENSE line.

High Voltage Power Supply

When the POWER SUPPLY to be used, Vdd, is a high-voltage supply, the switches S are placed into the position shown in FIG. 5. The gates G of the MOSFETs 3A and 6A are, respectively, LOW and HIGH, thereby keeping these MOSFETs OFF, as indicated by their phantom lines. Under these conditions, only the PRIMARY DRIVER sources or sinks current, and it operates as does the driver shown in FIG. 1.

Low Voltage Power Supply

When Vdd is a low-voltage supply, the switches S are placed into the position shown in FIG. 4. The gates G of all MOSFETs 3, 3A, 6, and 6A are connected in common. The operation is explained with reference to FIGS. 6 and 7.

FIG. 6

Figure 6:
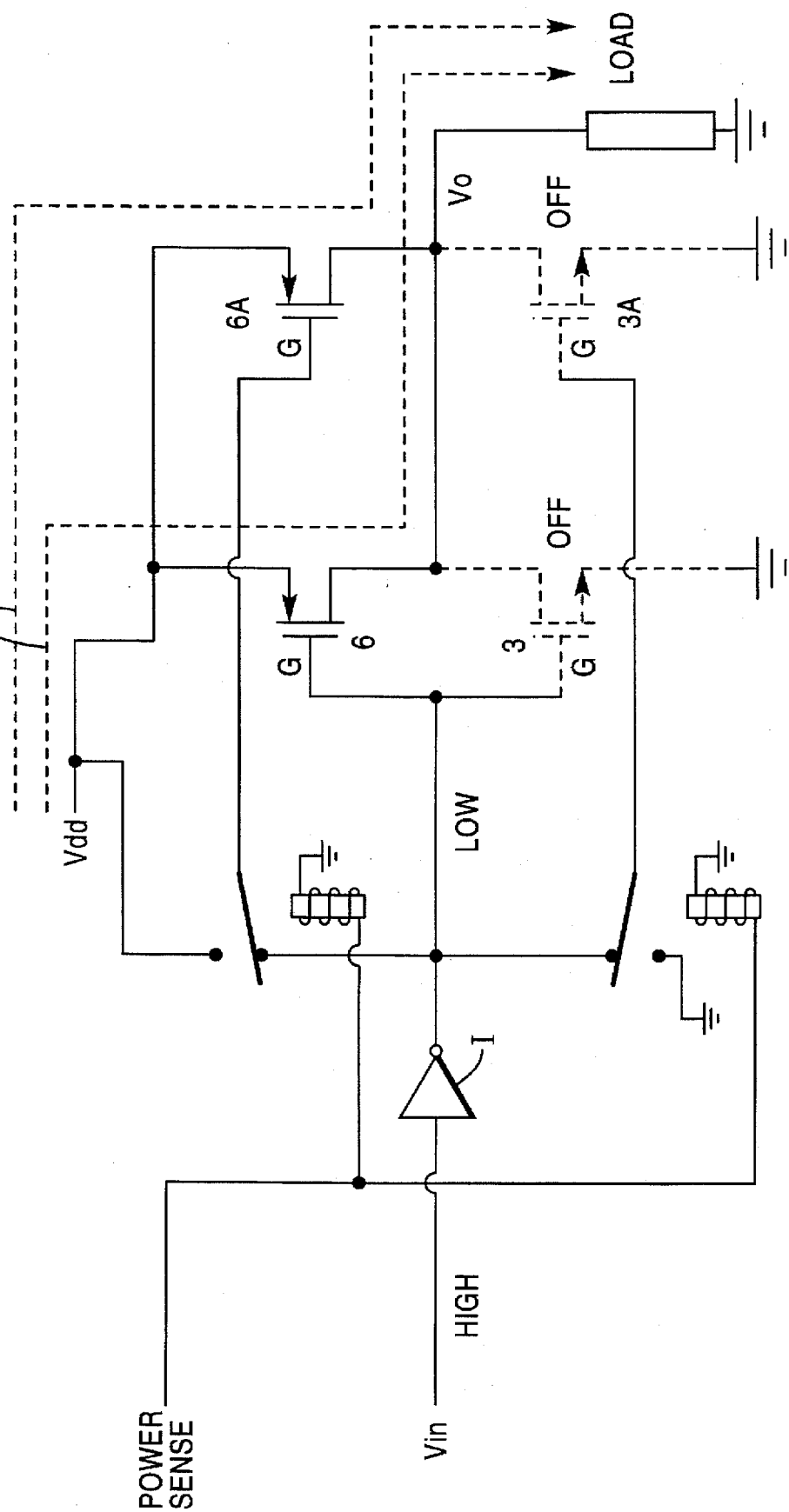
FIGS. 6 and 7 illustrate the operation of the invention of FIGS. 4 and 5.

When Vin is held HIGH, as in FIG. 6, the gates G are held LOW, by virtue of inverter I. MOSFETs 3 and 3A are held OFF, as indicated by the phantom shading. MOSFETs 6 and 6A are held ON, thereby sourcing current to the load through the two current paths indicated by the phantom lines.

FIG. 7

Figure 7:
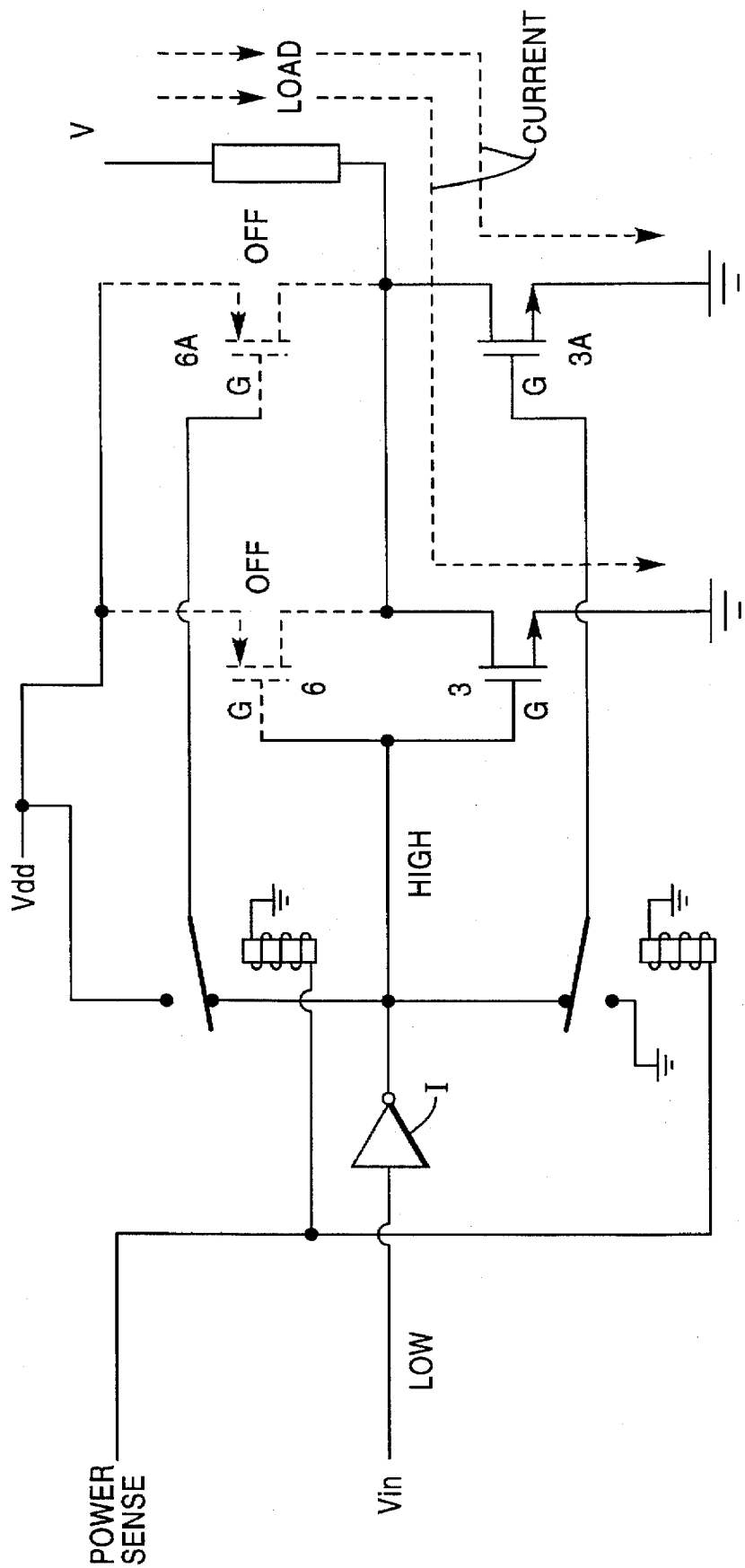

When Vin is held LOW, as in FIG. 7, the gates G are held HIGH, by virtue of inverter I. MOSFETs 6 and 6A are held OFF, as indicated by the phantom shading. MOSFETs 3 and 3A are held ON, thereby sinking current through the two current paths indicated by the phantom lines.

The switches S have been shown as relays, for ease of explanation. In practice, switches S will be solid state devices, as will now be explained.

More Detailed Explanation

Figure 8:
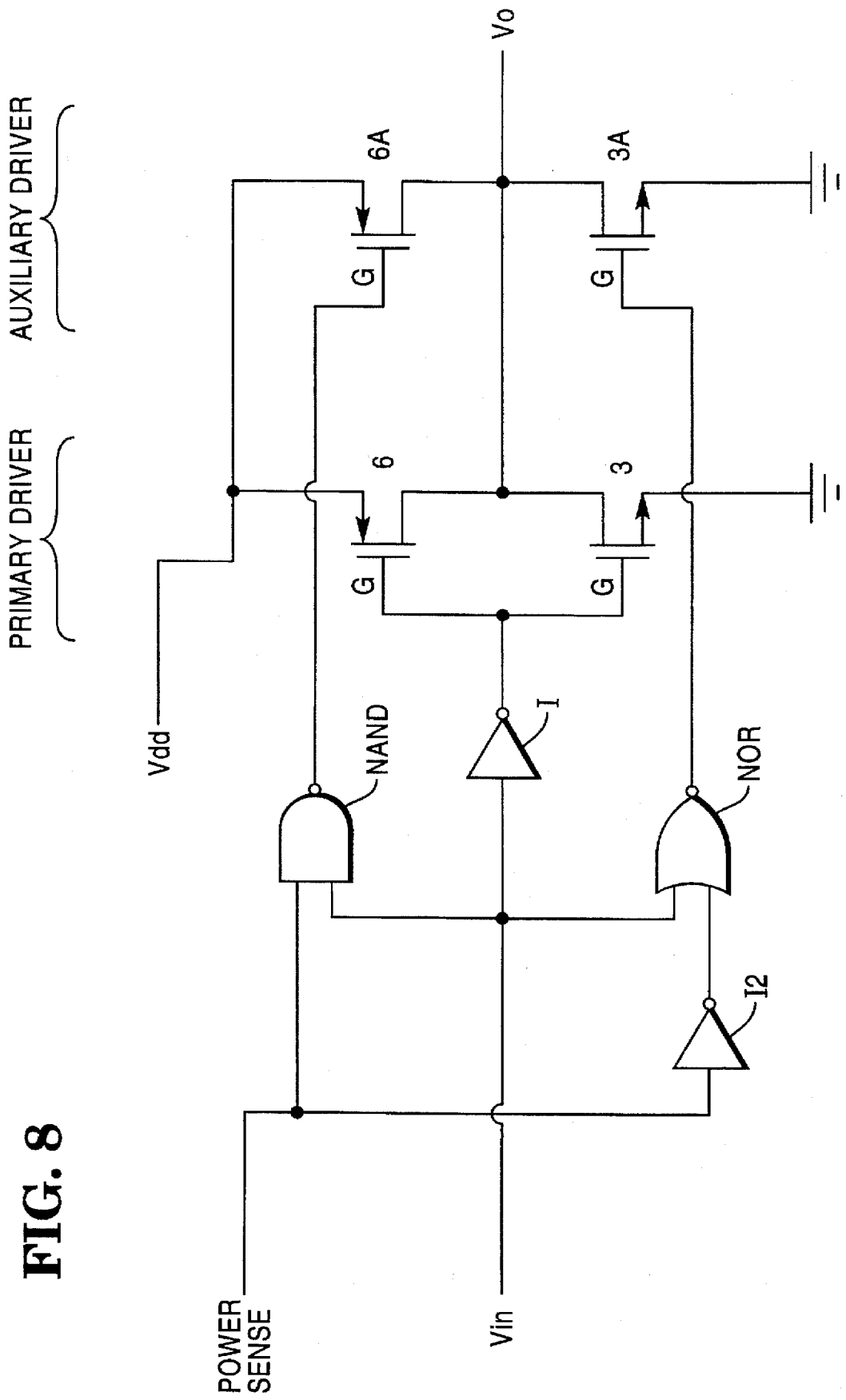
FIG. 8 illustrates another form of the invention.

FIG. 8 illustrates one form of the invention. The invention includes a PRIMARY DRIVER and an AUXILIARY DRIVER, each taking the form of a CMOS INVERTER. A POWER SENSE signal is applied to the NAND gate. This POWER SENSE signal is also inverted, by INVERTER 12, and applied to the NOR gate. Truth Tables for these NAND and NOR gates are given below.

| NAND TRUTH TABLE | | |
| --- | --- | --- |
| POWER SENSE | Vin | NAND Output |
| LO | LO | HI |
| LO | HI | HI |
| HI | LO | HI |
| HI | HI | LO |

| NOR TRUTH TABLE | | |
| --- | --- | --- |
| POWER SENSE (Inverted by 12) | Vin | NOR Output |
| LO | LO | HI |
| LO | HI | LO |
| HI | LO | LO |
| HI | HI | LO |

Operation When POWER SENSE is LOW

Figure 9:
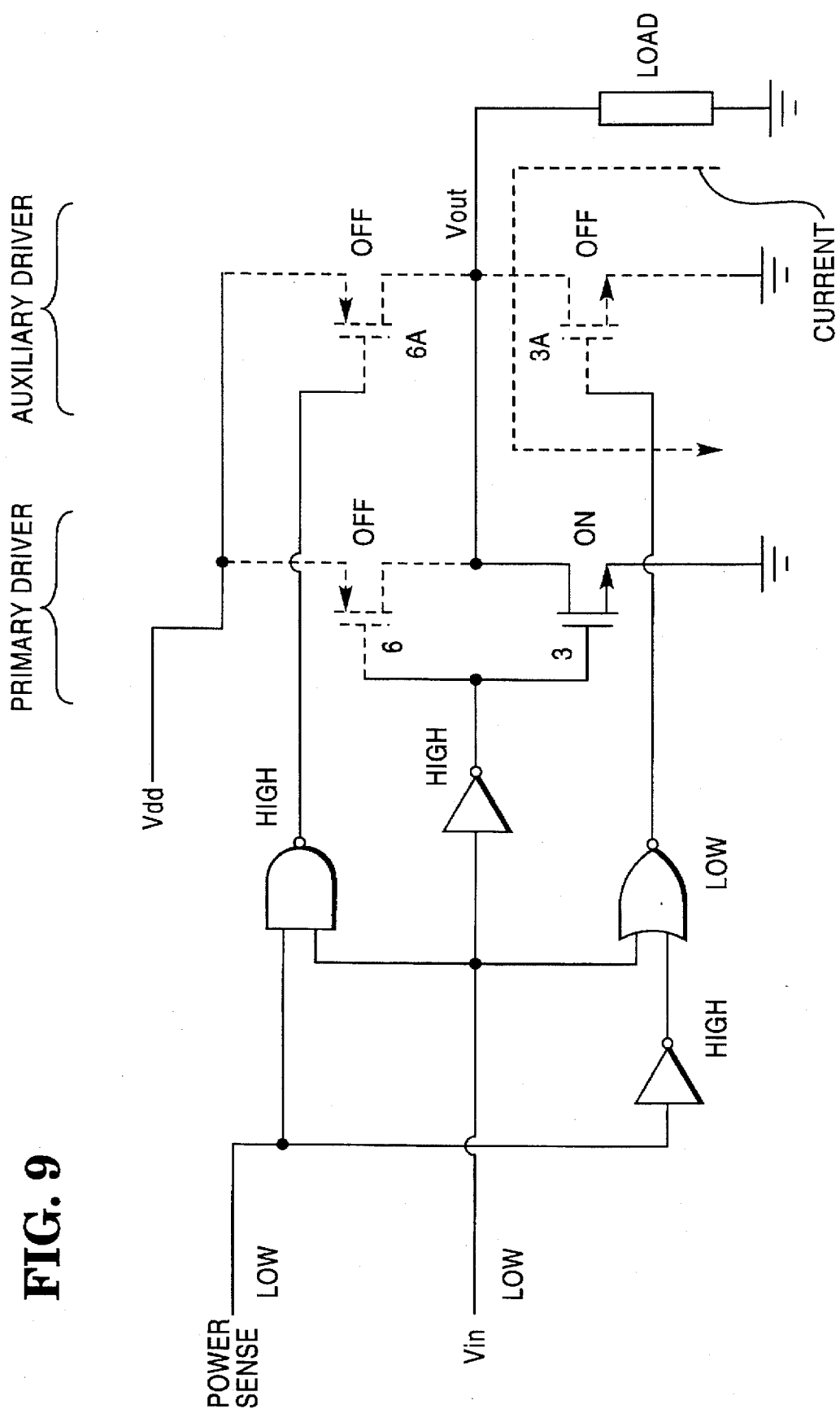
FIGS. 9–12 illustrate four operating modes of the apparatus of FIG. 8.

In FIG. 9, POWER SENSE is LOW. POWER SENSE is held LOW when Vdd is a high voltage, such as 5.0 volts.

This situation corresponds to the top two rows of the NAND Truth Table, and the bottom two rows of the NOR Truth Table. With POWER SENSE held LOW, the output of the NAND is always HIGH, no matter what value Vin acquires. The output of the NOR is always LOW, no matter what value Vin acquires.

Thus, MOSFETs 3A and 6A in the AUXILIARY DRIVER are always OFF. Signal Vin controls whether MOSFET 3 or 6, in the PRIMARY DRIVER, conducts.

When Vin is LOW, as in FIG. 9, MOSFET 6 is OFF, and MOSFET 3 is ON. MOSFET 3 sinks the CURRENT, as indicated. Conversely, when Vin is HIGH, as in FIG. 10, MOSFET 3 is OFF and MOSFET 6 is ON. MOSFET 6 sources the CURRENT, as indicated.

Operation when POWER SENSE IS HIGH

Figure 11:
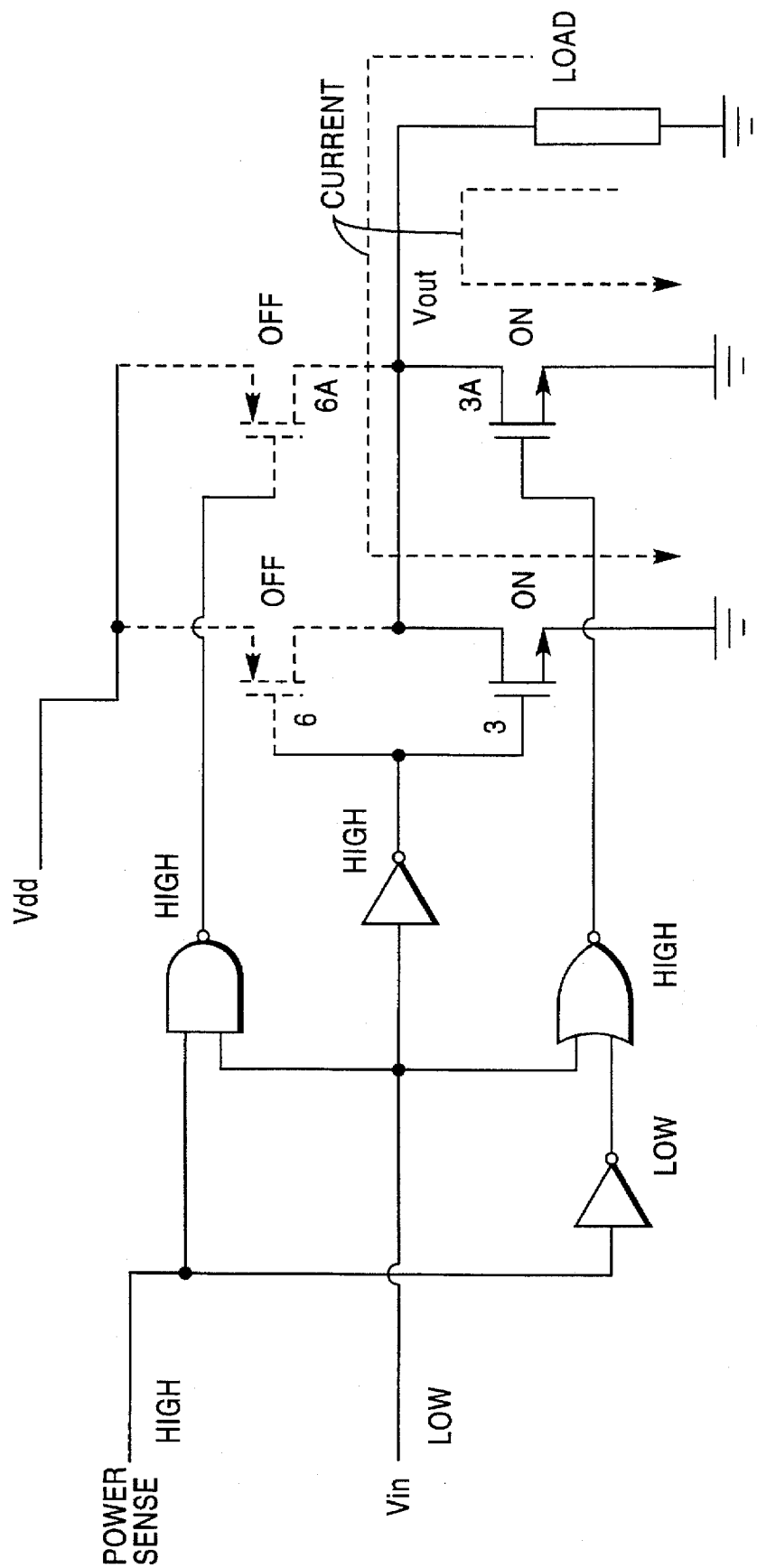

In FIG. 11, POWER SENSE is HIGH. POWER SENSE is held HIGH when Vdd is a low voltage, such as 3.3 volts. This situation corresponds to the bottom two rows of the NAND Truth Table, and the top two rows of the NOR Truth Table, above. Under these circumstances, the output of the NAND is opposite to Vin. Similarly, the output of the NOR is opposite to Vin.

When Vin is LOW, as in FIG. 11, both MOSFETs 6 and 6A are OFF, and both MOSFETs 3 and 3A are ON. These latter MOSFETs 3 and 3A sink the CURRENTs shown.

Figure 12:
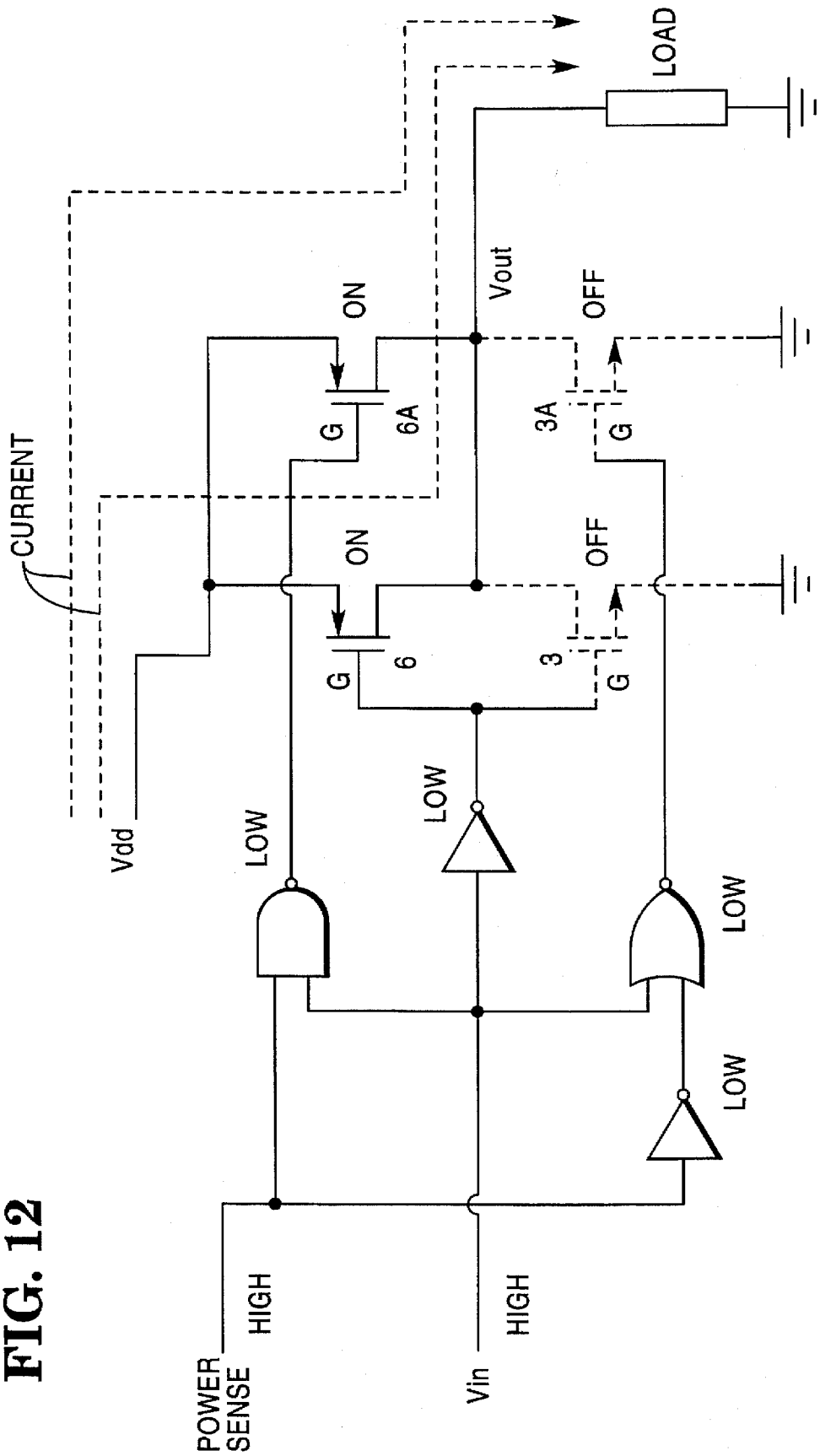

When Vin is HIGH, as in FIG. 12, both MOSFETs 3 and 3A are OFF, and both MOSFETs 6 and 6A are ON. These latter MOSFETs 6 and 6A source the CURRENTs shown.

Therefore, POWER SENSE controls how many transistors (MOSFETs in the examples above) source or sink current. If POWER SENSE is LOW, only a single transistor sinks current (in FIG. 9) or sources current (in FIG. 10). If POWER SENSE is HIGH, two transistors sink current (in FIG. 11) or two transistors source current (in FIG. 12).

Accordingly, the current sunk can be doubled (approximately), by doubling the number of sinking transistors, yet the voltage drop across the transistors remains the same (approximately). The voltage drop remains the same because the current through either transistor stays substantially the same, and thus the voltage drop across the transistor remains the same.

A similar principle applies to sourcing current: the number of transistors involved in sourcing is doubled when the voltage supply is reduced from 5.0 volts to 3.3 volts. But since the current through either transistor remains about the same, the voltage drop across either transistor does not change.

Additional Considerations

1. When POWER SENSE is logic ONE, the MOSFETs in the AUXILIARY DRIVER are effectively in parallel with those in the PRIMARY DRIVER. That is, the sources of the p-channel MOSFETs 6 and 6A (termed P-MOS herein) are connected together;

the sources of the n-channel MOSFETs 3 and 3A (termed N-MOS herein) N-MOS transistors are connected together;

the drains of all MOSFETs are connected together; and although the gates of all transistors are not connected together, an equivalent logic signal is applied to all of them (when POWER SENSE is logic ONE).

Thus, the MOSFETs are connected in parallel, except for the gates. But since the same logic signal is applied to the gates, the gates cannot "tell" that they are not actually connected together. The gates are "effectively" in parallel.

When POWER SENSE is ZERO, the AUXILIARY DRIVER is inactive. The parallel connection has been terminated.

2. The signal POWER SENSE is generated in a known manner. For example, the driver shown in FIG. 8 may be located on an integrated circuit which is powered by a 3.3 volt supply. If one never expects that the power supply will change, then POWER SENSE can be permanently tied to a logic ONE.

On the other hand, the integrated circuit in question may be powered by a 5.0 volt supply, which is never expected to change. In this case, the POWER SENSE line can be tied to a logic ZERO.

If it is expected that the power supply will change, the POWER SENSE line can be placed under the control of a user, or automated sensing equipment (not shown). The sensing equipment detects the supply voltage and applies the proper signal to POWER SENSE. Such sensing equipment is known in the art.

For example, a voltage comparator, known in the art, can compare the supply voltage with a reference, such as 4.0 volts. When the supply voltage is 3.3 volts, the comparator (perhaps through an inverter) pulls POWER SENSE HIGH. When the supply voltage is 5 volts, the comparator pulls POWER SENSE to a LOW state.

3. The current sourced can be doubled (see FIGS. 10 and 12), yet the output voltage Vout will remain virtually the same. The reason is that the added current is carried by an additional transistor (MOSFET 6A in FIG. 12). No substantial current is added to the original transistor (MOSFET 6).

Similarly, the current sunk can be doubled (see FIGS. 9 and 11), yet the output voltage Vout will remain virtually the same. The reason is that the added current is carried by an additional transistor (MOSFET 3A in FIG. 11). No substantial current is added to the original transistor (MOSFET 3).

Stated another way, the driver maintains a substantially constant output voltage Vo when the supply voltage changes and when the load remains the same. In the examples given above, the change in supply voltage was 1.7 volts.

4. The most likely configuration expected for the invention is this: the invention will be connected into a fixed environment, where the driver always SOURCES or always SINKS a given load. The load remains the same. Only the power supply is expected to change.

Figure 10:
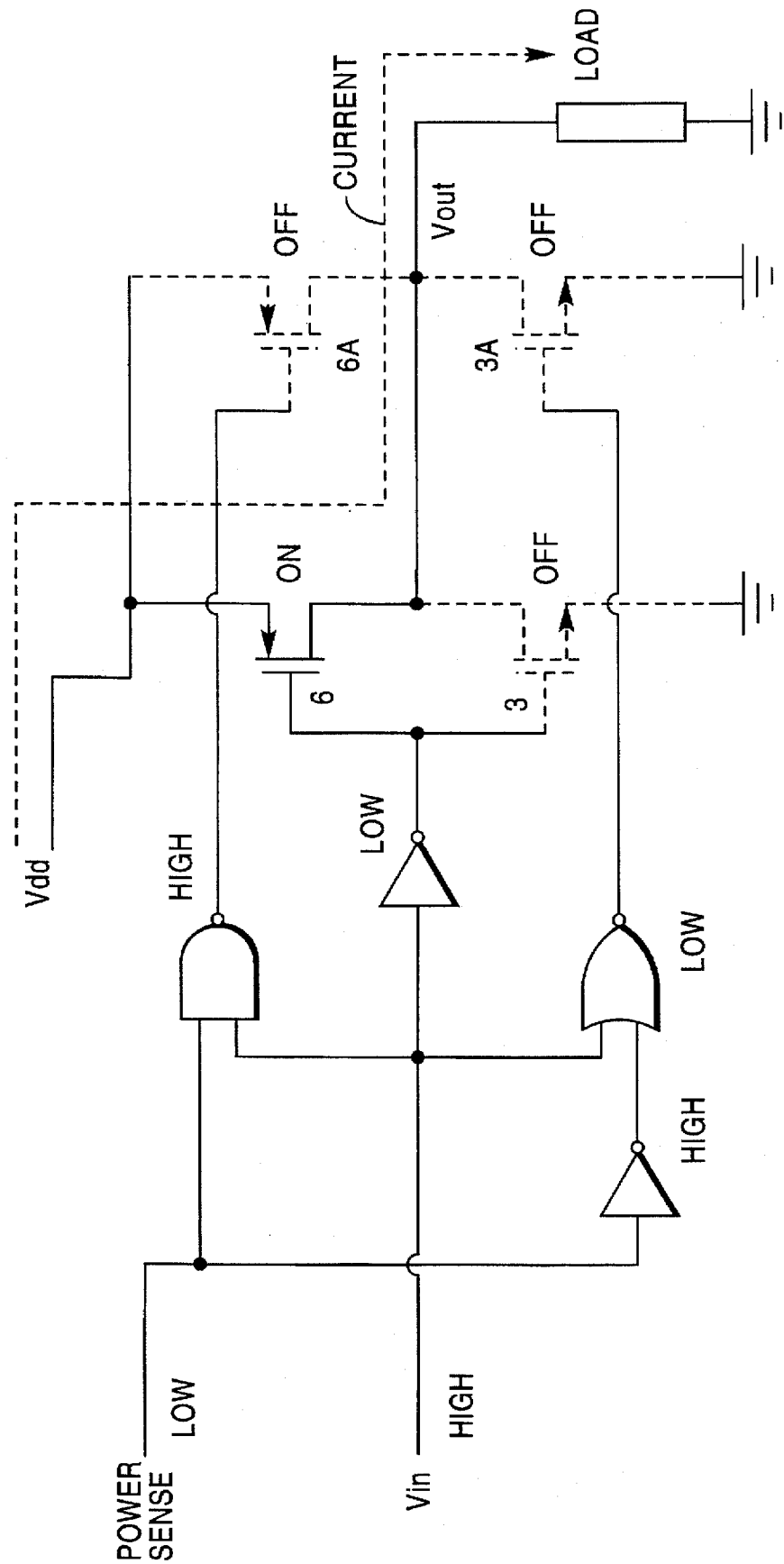

For example, the situation is expected to change from that of FIG. 9 to FIG. 11 (or the reverse), or from that of FIG. 10 to FIG. 12 (or the reverse). It is not expected that the situation will change from FIG. 9 to FIG. 12.

Numerous substitutions and modifications can be undertaken without departing from the true spirit and scope of the invention. What is desired to be secured by Letters Patent is the Invention as defined in the following claims.

I claim:

1. In an electronic driver circuit for driving a load, wherein the driver circuit is powered by a supply voltage and provides an output signal in response to an input signal, the improvement comprising:

means for causing the driver circuit to produce a substantially constant output voltage when the supply voltage changes by at least one and one-half volts and the load remains the same, by selectively activating at least one of a plurality of driver circuit transistors.

2. An electronic driver, comprising:
   a) a first CMOS inverter;
   b) a second CMOS inverter; and
   c) switching means for selectively connecting the second CMOS inverter effectively in parallel with the first CMOS inverter.

3. An electronic driver circuit, adaptable to first and second supply voltages, comprising:
   a) means for sourcing a current to a load by at least one first transistor, at a first load voltage, when powered by the first supply voltage; and
   b) means for sourcing a larger current to the load by at least one second transistor, at the first load voltage, when powered by the second supply voltage.

4. An electronic circuit, comprising:
   a) a first p-channel MOSFET having a source (S1), a drain (D1), and a gate (G1);
   b) a second p-channel MOSFET having a source (S2), a drain (D2), and a gate (G2);
   c) a first n-channel MOSFET having a source (S3), a drain (D3), and a gate (G3);
   d) a second n-channel MOSFET having a source (S4), a drain (D4), and a gate (G4);
   e) a NAND gate having a first input (IN1), a second input (IN2) and an output (O1);
   f) a NOR gate having a first input (IN3), a second input (IN4) and an output (O2);
   g) an input signal line (Vin);
   h) a first inverter (I) for receiving the input signal line (Vin) and producing an inverted signal (Vin");
   i) a POWER SENSE line connected to the first input of the NAND gate (IN1);
   j) a second inverter (I2) interconnected between the POWER SENSE line and the first input of the NOR gate (IN3);
   k) means for connecting the gate of the second p-channel MOSFET (G2) with the output of the NAND gate (O1);
   l) means for connecting the gate of the second n-channel MOSFET (G4) with the output of the NOR gate (O2);
   m) means for connecting the drains of the first and second p-channel MOSFETS and the first and second n-channel MOSFETS (D1, D2, D3, and D4) together;
   n) means for connecting the sources of the first and second p-channel MOSFETS (S1 and S2) to a high voltage supply;
   o) means for connecting the sources of the first and second n-channel MOSFETS (S3 and S4) to a low voltage supply; and p) means for connecting the gate of the first p-channel MOSFET (G1) and the gate of the first n-channel MOSFET (G3) with the inverted signal (Vin");

wherein the POWER SENSE line is effective for selectively turning OFF both the second p-channel MOSFET and the second n-channel MOSFET.

5. Apparatus according to claim 4, and further comprising q) a power supply for supplying a voltage (Vdd) to sources of the first and second p-channel MOSFETS (S1 and S2); and r) sensing equipment for
  i) comparing the power supply voltage (Vdd) to a reference, and
  ii) when the power supply voltage (Vdd) exceeds the reference, applying a signal to the POWER SENSE line.

6. Apparatus according to claim 4, and further comprising q) a power supply for supplying a voltage (Vdd) to the sources of the first and second p-channel MOSFETS (S1 and S2); and r) sensing equipment for
  i) comparing the power supply voltage (Vdd) to a reference, and
  ii) when the power supply voltage (Vdd) exceeds the reference, pulling the POWER SENSE line to a logic HIGH state, and
  iii) when the reference exceeds the power supply voltage (Vdd), pulling the POWER SENSE line to a logic LOW state.

7. An apparatus, comprising:

an electronic driver circuit, powered by a supply voltage, for providing an output signal in response to an input signal; and means for causing the driver circuit to produce a substantially constant output voltage across a load when the supply voltage changes by selectively activating at least one of a plurality of driver circuit transistors.

8. In an electronic driver circuit for driving a load, wherein the driver circuit is powered by a supply voltage and provides an output signal in response to an input signal, a method of causing the driver circuit to produce a substantially constant output voltage when the supply voltage changes by at least one and one-half volts and the load remains the same, by selectively activating at least one of a plurality of driver circuit transistors.

9. In an electronic driver circuit, powered by a supply voltage, for providing an output signal in response to an input signal, a method of causing the driver circuit to produce a substantially constant output voltage across a load when the supply voltage changes by selectively activating at least one of a plurality of driver circuit transistors.

* * * * *